(12) United States Patent
Hsieh et al.

(10) Patent No.: US 12,324,302 B2
(45) Date of Patent: Jun. 3, 2025

(54) DUAL PLATE OLET DISPLAYS

(71) Applicant: Hewlett-Packard Development Company, L.P., Spring, TX (US)

(72) Inventors: Hsing-Hung Hsieh, Taipei (TW); Kuan-Ting Wu, Taipei (TW); Chi Hao Chang, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 434 days.

(21) Appl. No.: 17/795,016

(22) PCT Filed: Feb. 11, 2020

(86) PCT No.: PCT/US2020/017699
§ 371 (c)(1),
(2) Date: Jul. 25, 2022

(87) PCT Pub. No.: WO2021/162680
PCT Pub. Date: Aug. 19, 2021

(65) Prior Publication Data
US 2023/0055348 A1    Feb. 23, 2023

(51) Int. Cl.
*H10K 50/30* (2023.01)
*H10K 59/12* (2023.01)
*H10K 71/00* (2023.01)

(52) U.S. Cl.
CPC ............. *H10K 50/30* (2023.02); *H10K 59/12* (2023.02); *H10K 71/00* (2023.02); *H10K 59/1201* (2023.02)

(58) Field of Classification Search
CPC ........ H10K 50/30; H10K 59/12; H10K 71/00; H10K 59/1201; H10K 10/482; H10K 59/128
See application file for complete search history.

(56) References Cited

U.S. PATENT DOCUMENTS 7,754,521 B2    7/2010    Park
8,022,401 B2    9/2011    Saito et al.
(Continued)

FOREIGN PATENT DOCUMENTS

CN    1637615 A    7/2005
CN    1992333 A    7/2007
(Continued)

OTHER PUBLICATIONS

Hou, Lili, et al. "Optically switchable organic light-emitting transistors." Nature Nanotechnology, vol. 14, No. 4, Feb. 18, 2019, pp. 347-353, https://doi.org/10.1038/s41565-019-0370-9. (Year: 2019).*

*Primary Examiner* — J. E. Schoenholtz
(74) *Attorney, Agent, or Firm* — Quarles & Brady LLP

(57) ABSTRACT

An example dual plate Organic Light-Emitting Field-Effect Transistor (OLET) display device includes a first plate device having a first substrate; a gate layer adjacent to the first substrate; and a dielectric layer adjacent to the gate layer. A second plate device is connected to the first plate device. The second plate device includes a second substrate; a source/drain layer adjacent to the second substrate; and a stacked active organic layer adjacent to the source/drain layer. The first plate device and the second plate device are to be independently fabricated and joined together to position the stacked active organic layer adjacent to the dielectric layer.

20 Claims, 15 Drawing Sheets

(56) References Cited

U.S. PATENT DOCUMENTS

| | | | |
|---|---|---|---|
| 8,999,749 B2 * | 4/2015 | Fujimoto | H10K 71/00 |
| | | | 257/40 |
| 9,240,570 B2 | 1/2016 | Cho et al. | |
| 9,406,909 B2 | 8/2016 | Kim | |
| 10,409,159 B2 | 9/2019 | Zhao et al. | |
| 2014/0014885 A1 * | 1/2014 | Pan | H10K 85/6572 |
| | | | 548/310.7 |
| 2014/0027752 A1 * | 1/2014 | Fujimoto | H10K 71/50 |
| | | | 257/40 |
| 2016/0181537 A1 * | 6/2016 | Pan | H10K 85/151 |
| | | | 528/211 |
| 2020/0266393 A1 * | 8/2020 | Tang | G09G 3/3291 |
| 2021/0167335 A1 * | 6/2021 | Li | H10K 10/84 |

FOREIGN PATENT DOCUMENTS

| | | |
|---|---|---|
| KR | 10-0557731 B1 | 3/2006 |
| KR | 10-1931409 B1 | 12/2018 |
| WO | 2019/114502 A1 | 6/2019 |

* cited by examiner

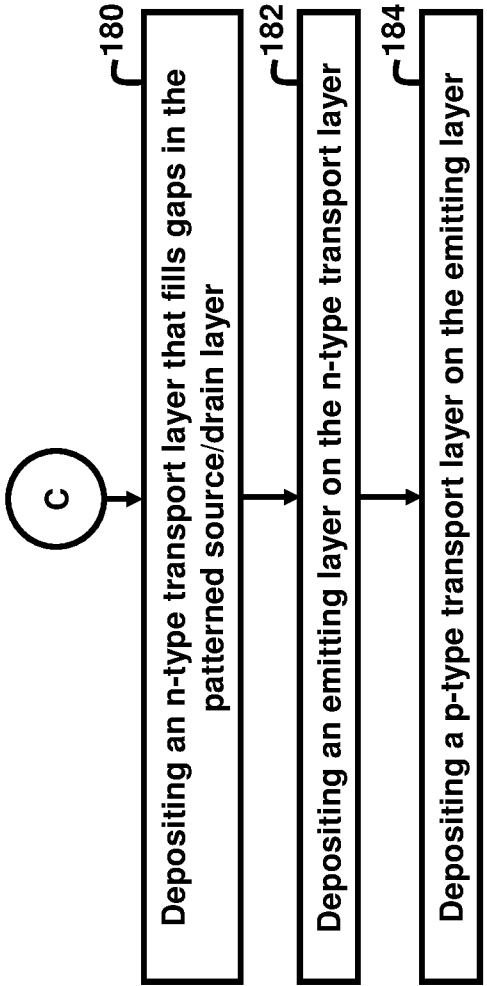

DUAL PLATE OLET DISPLAYS

BACKGROUND

An Organic Light-Emitting Field-Effect Transistor (OLET) combines thin film transistor function with light emission properties and without using thin film transistors in its construction. For example, OLETs may be utilized in pixel circuits. Such pixel circuits may be implemented in display screens such as flat panel displays and other active-matrix displays.

BRIEF DESCRIPTION OF THE DRAWINGS

The following detailed description references the drawings, in which:

FIG. 11D is a flow diagram illustrating a method of depositing a stacked active organic layer, according to an example.

FIG. 11E is a flow diagram illustrating a method of depositing a stacked active organic layer, according to an example.

Figure 1:
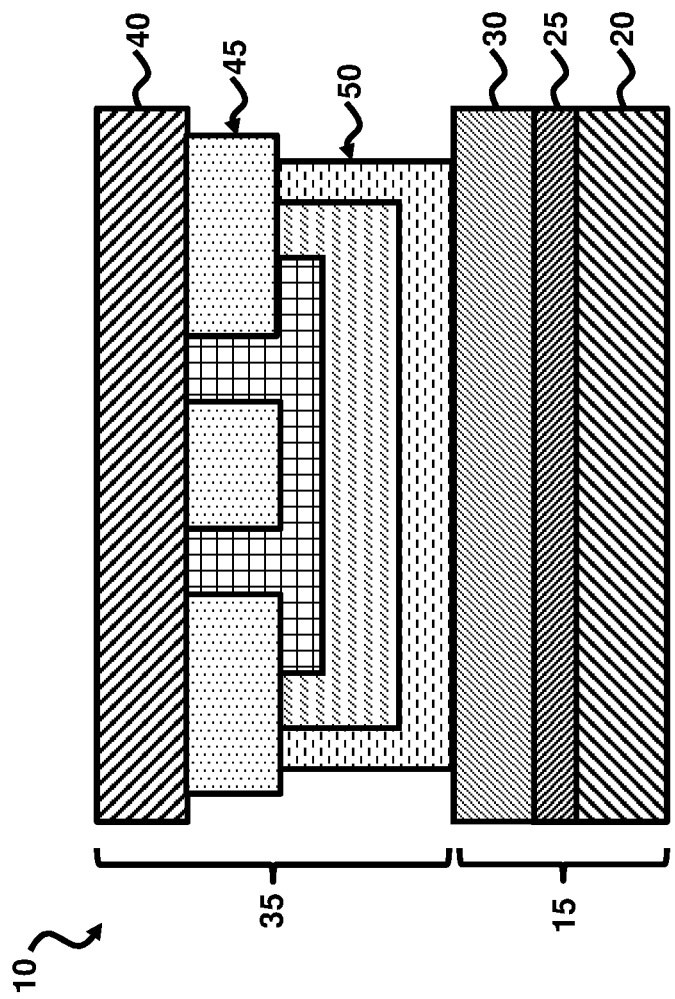
FIG. 1 is a schematic cross-sectional diagram illustrating a dual plate OLET display device, according to an example.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

OLET devices may include a tri-layer structure to provide the charge transport and other transistor behaviors as well as electroluminescence for the device. The resolution offered by an OLET device may be limited because of the tri-layer structure as well as the fabrication process. For example, the organic active channel layers provided by the tri-layer structure typically cannot sustain photolithography processes, and accordingly a shadow masking approach is used for patterning the tri-layer structure as well as the electrodes. However, in a shadow mask technique the channel length of the OLET device is typically large; e.g., >20 µm. Accordingly, a high-resolution display may be difficult to be realized. Furthermore, the cost for performing a shadow masking technique is generally higher than for a photolithography process. While a tri-layer structure continues to offer a high-performance structure for OLET devices, a new configuration of the tri-layer may yield improved resolution for the displays, as an example.

An example disclosed herein is a dual plate OLET device and method of manufacture. A gate layer and a dielectric layer are disposed on a first substrate. Source (S) and drain (D) electrodes are disposed to form an S/D layer on a second substrate. Above the S/D layer, a plurality of organic layers comprising of a positive transport layer, an emission layer, and a negative transport layer are fabricated. Then, using a flip technique, both individual devices are laminated to form a dual OLET device. The OLET is fabricated in such a way that the negative transport layer fills the spacing of the S/D layer. Moreover, the shape of the source electrode is planar as opposed to a step-shaped configuration, and the organic layers are arranged in such a way that each layer covers the other subsequent layer.

Accordingly, it is possible to combine the function of a thin-film transistor (TFT) and an organic light-emitting diode (OLED) using an OLET and without utilizing TFTs, which rely on current driven techniques for operation. The feature size of the dual OLET device is provided for high resolution display. In addition, by replacing one of the shadow-masking processes to form the S/D layer by photolithography process, it is possible to reduce the fabrication cost and improve the production yield. In addition, according to examples, the method facilitates mass productivity, lower fabrication costs, and achieves higher device resolution, improved both P and N injection, lower voltage triggering, lower power consumption, and longer lifetime of the device. The examples described herein utilize a voltage driven approach for operating a dual plate OLET display device, which increases stability and uniformity of the device, which assists in achieving efficiencies and reducing costs in mass production environments.

As described below, the term adjacent refers to direct contact between components or features. An example provides a dual plate OLET display device comprising a first plate device comprising a first substrate; a gate layer adjacent to the first substrate; and a dielectric layer adjacent to the gate layer. A second plate device is connected to the first plate device. The second plate device comprises a second substrate; a source/drain layer adjacent to the second substrate. A stacked active organic layer is adjacent to the source/drain layer. The first plate device and the second plate device are to be independently fabricated and joined together to position the stacked active organic layer adjacent to the dielectric layer. The source/drain layer may comprise a first side comprising a first planar surface contacting the second substrate; and a second side opposite to the first side. An entirety of the second side may comprise a second planar surface contacting the stacked active organic layer. The stacked active organic layer may comprise an n-type transport layer; an emitting layer partially surrounding the n-type transport layer; and a p-type transport layer partially surrounding the emitting layer. The n-type transport layer may contact the second planar surface and the second substrate. The p-type transport layer may contact the second planar surface. The emitting layer may contact the second planar surface. The emitting layer may surround three sides of the n-type transport layer. The p-type transport layer may surround three sides of the emitting layer. The p-type transport layer may surround three sides of the n-type transport layer. In another example, the stacked active organic layer may comprise a p-type transport layer; an emitting layer partially surrounding the p-type transport layer; and an n-type transport layer partially surrounding the emitting layer.

Another example provides a dual plate OLET display device comprising a first substrate; a gate layer contacting the first substrate; a dielectric layer contacting the gate layer; a stacked active organic layer contacting the dielectric layer; a pair of source electrodes contacting the stacked active organic layer; a drain electrode contacting the stacked active organic layer. The drain electrode is aligned and spaced apart from the pair of source electrodes. The OLET display device also includes a second substrate contacting the pair of source electrodes, the drain electrode, and a portion of the stacked active organic layer. The first substrate, the gate layer, and the dielectric layer are fabricated together prior to connecting the dielectric layer to the stacked active organic layer. Each side of the pair of source electrodes and the drain electrode may be planar. A gap may exist between the drain electrode and a source electrode of the pair of source electrodes. The gap may be formed or defined between the drain electrode and each source electrode. The gap may be less than 3 µm. The stacked active organic layer may comprise an n-type transport layer that fills the gap and contacts the second substrate; an emitting layer partially surrounding the n-type transport layer; and a p-type transport layer partially surrounding the emitting layer. The p-type transport layer may contact the dielectric layer. In another example, the stacked active organic layer may comprise a p-type transport layer that fills the gap and contacts the second substrate; an emitting layer partially surrounding the p-type transport layer; and an n-type transport layer partially surrounding the emitting layer. The n-type transport layer may contact the dielectric layer.

Another example provides a method of manufacturing a semiconductor device, the method comprising forming a first OLET display device; forming a second OLET display device independently of the first OLET display device; and attaching the first OLET display device to the second OLET display device. Forming the first OLET display device may comprise providing a first substrate; depositing a gate layer on the first substrate; and depositing a dielectric layer on the gate layer. Forming the second OLET display device may comprise providing a second substrate; depositing a source/drain layer on the second substrate; patterning, such as using shadow masking techniques, the source/drain layer such that each surface of patterned source and drain electrodes are planar; and depositing a stacked active organic layer on the source/drain layer. Depositing the stacked active organic layer may comprise depositing an n-type transport layer that fills gaps in the patterned source/drain layer. The n-type transport layer may contact the second substrate and source and drain electrodes in the source/drain layer. Depositing the stacked active organic layer may comprise depositing an emitting layer on the n-type transport layer. The emitting layer may contact source electrodes in the source/drain layer. Depositing the stacked active organic layer may comprise depositing a p-type transport layer on the emitting layer. The p-type transport layer may contact the source electrodes in the source/drain layer. In another example, depositing the stacked active organic layer may comprise depositing a p-type transport layer that fills gaps in the patterned source/drain layer. The p-type transport layer may contact the second substrate and source and drain electrodes in the source/drain layer. Depositing the stacked active organic layer may comprise depositing an emitting layer on the p-type transport layer. The emitting layer may contact source electrodes in the source/drain layer. Depositing the stacked active organic layer may comprise depositing an n-type transport layer on the emitting layer. The n-type transport layer may contact the source electrodes in the source/drain layer.

In the drawings and descriptions below, similar reference characters denote corresponding features consistently throughout the figures. FIG. 1 is a schematic cross-sectional diagram illustrating an example dual plate OLET display device 10 comprising a first plate device 15 comprising a first substrate 20. The first plate device 15 may be referred to as a semiconductor device in an example as the first plate device 15 may comprise semiconductor materials and exhibit semiconductor functions including electron transfer among layers as well as current flow, among other characteristics. In an example, the first substrate 20 may comprise glass or plastic material such as polyimide, or some other suitable material. The first plate device 15 also comprises a gate layer 25 adjacent to the first substrate 20. The gate layer 25 may function as an electrode receiving voltage and controlling the amount of charge carriers in the dual plate OLET display device 10. In some examples, the gate layer 25 may comprise heavy doped silicon or some other suitable conducting material such as Mo, Al, Cu, Ti, Ag, Au, indium tin oxide (ITO), and indium zinc oxide (IZO). According to an example, the gate layer 25 may have a thickness of approximately 50-500 nm, although other thicknesses may be possible. The first plate device 15 also includes a dielectric layer 30 adjacent to the gate layer 25. In an example, the dielectric layer 30 may be thermally grown on the gate layer 25 serving as the gate dielectric. The thermally grown technique may utilize standard microfabrication techniques involving thermal oxidation applied to substrates. For example, the dielectric layer 30 may comprise silicon oxide (SiO), silicon dioxide ($SiO_2$), silicon nitride (SiN), an insulated polymer, or organic polymer materials such as poly (methyl-methacrylate) (PMMA), or other suitable high-k material (i.e., k~20). According to an example, the dielectric layer 30 may have a thickness of approximately 100-1000 nm, although other thicknesses may be possible.

The dual plate OLET display device 10 further comprises a second plate device 35 that is connected to the first plate device 15. The second plate device 35 may be referred to as a semiconductor device in an example as the second plate device 35 may comprise semiconductor materials and exhibit semiconductor functions including electron transfer among layers as well as current flow, among other characteristics. The second plate device 35 comprises a second substrate 40. In an example, the second substrate 40 may comprise glass or plastic material such as polyimide, or some other suitable material. According to an example, the first substrate 20 and the second substrate 40 comprise the same type of materials as each other. In another example, the first substrate 20 and the second substrate 40 comprise different materials as each other. The second plate device 35 also includes a source/drain layer 45 adjacent to the second substrate 40. The source/drain layer 45 may be patterned to create electrodes that are spaced apart; i.e., having a channel width, from each other in the source/drain layer 45. Moreover, the source/drain layer 45 may comprise heavy doped silicon, Mo, Al, Cu, Ti, Ag, Au, ITO, IZO, or some other suitable conducting material. According to an example, the source/drain layer 45 may have a thickness of approximately 50-500 nm, although other thicknesses may be possible.

The second plate device 35 further comprises a stacked active organic layer 50 that is adjacent to the source/drain layer 45. According to an example, the stacked active organic layer 50 is where charge transport and electroluminescence originates. In an example, the stacked active organic layer 50 is arranged as a tri-layer structure, generates various colors, and provides high external quantum efficiency (EQE) along with moderate transistor behaviors. For example, the EQE may reach 5%. In an example, the high external EQE may be achieved due to the hole accumulation, electron accumulation, and exciton formation occurring in different layers of the tri-layered stacked active organic layer 50. In this regard, exciton-charge quenching may be avoided. Accordingly, the geometrical arrangement of the stacked active organic layer 50 helps to promote the decrease of exciton quenching and reduction of photon losses, which enhances the light-generating performance of the dual plate OLET display device 10. According to an example, the stacked active organic layer 50 may have a thickness of approximately 30-150 nm, although other thicknesses may be possible.

During the manufacturing process of the dual plate OLET display device 10, the first plate device 15 and the second plate device 35 are to be independently fabricated and joined together to position the stacked active organic layer 50 adjacent to the dielectric layer 30. In particular, the first plate device 15 is fabricated separately from the second plate device 35. Upon independent fabrication of the first plate device 15 and the second plate device 35, the second plate device 35 is attached to the first plate device using any suitable attachment process including flip-technology and lamination, among other processes.

Figure 2:
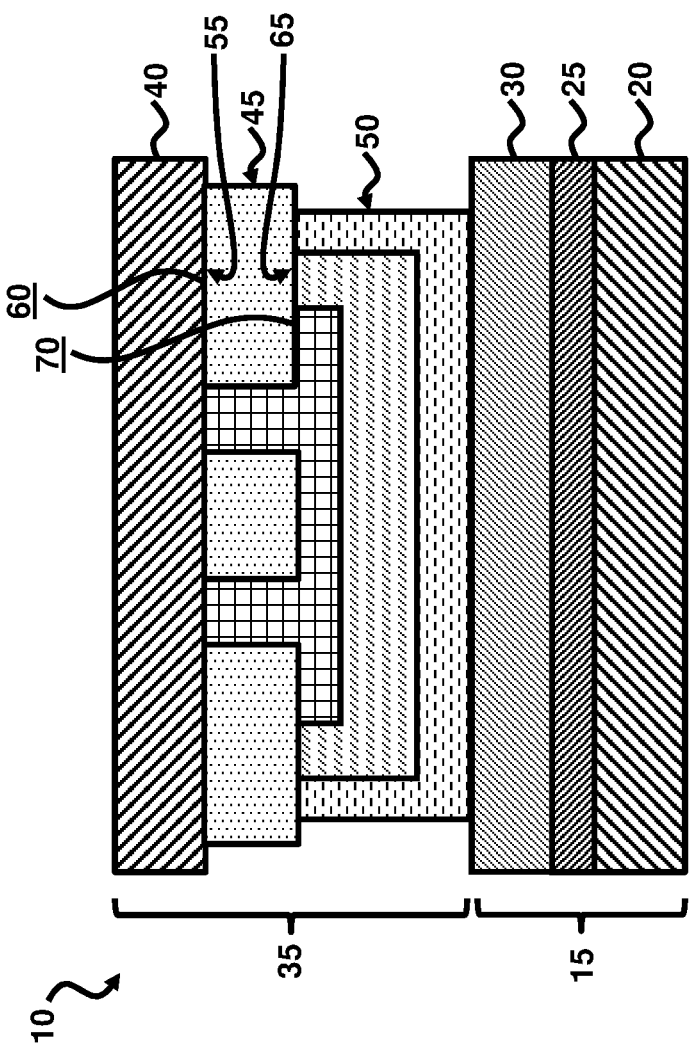
FIG. 2 is a schematic cross-sectional diagram illustrating the dual plate OLET display device of FIG. 1 showing aspects of the source/drain layer with respect to the stacked active organic layer, according to an example.

FIG. 2, with reference to FIG. 1, is a schematic cross-sectional diagram illustrating an example in which the source/drain layer 45 may comprise a first side 55 comprising a first planar surface 60 contacting the second substrate 40. The source/drain layer 45 may also comprise a second side 65 opposite to the first side 55. In this regard, the first side 55 and the second side 65 are on opposite sides of the source/drain layer 45. An entirety of the second side 65 comprises a second planar surface 70 contacting the stacked active organic layer 50. Accordingly, the first planar surface 60 and the second planar surface 70 are on opposite sides of the source/drain layer 45 such that the first planar surface 60 and the second planar surface 70 face in opposite directions from each other. For clarity of illustration, the drawings reference the first side 55, second side 65, first planar surface 60, and second planar surface 70 with respect to one of the electrodes in the source/drain layer 45. However, these corresponding features; i.e., the first side 55, second side 65, first planar surface 60, and second planar surface 70, occur in each of the electrodes of the source/drain layer 45. The planar shape of the source/drain layer 45 as provided by the first planar surface 60 and the second planar surface 70 may achieve greater stability of the dual plate OLET display device 10 from a performance point of view. Contrast this to a step or ladder shaped source/drain layer 45, where the source/drain may not be able to fill all the space in the step/ladder geometric arrangement, which results in some empty space in the overall device, and which leads to a device that is less robust and less reliable in terms of performance. Additionally, the planar shape of the source/drain layer 45 is further distinguished from a step/ladder configuration because of the step/ladder shape may create some pikes or electric field non-uniformity, which may further result in less reliable device performance.

Figure 3:
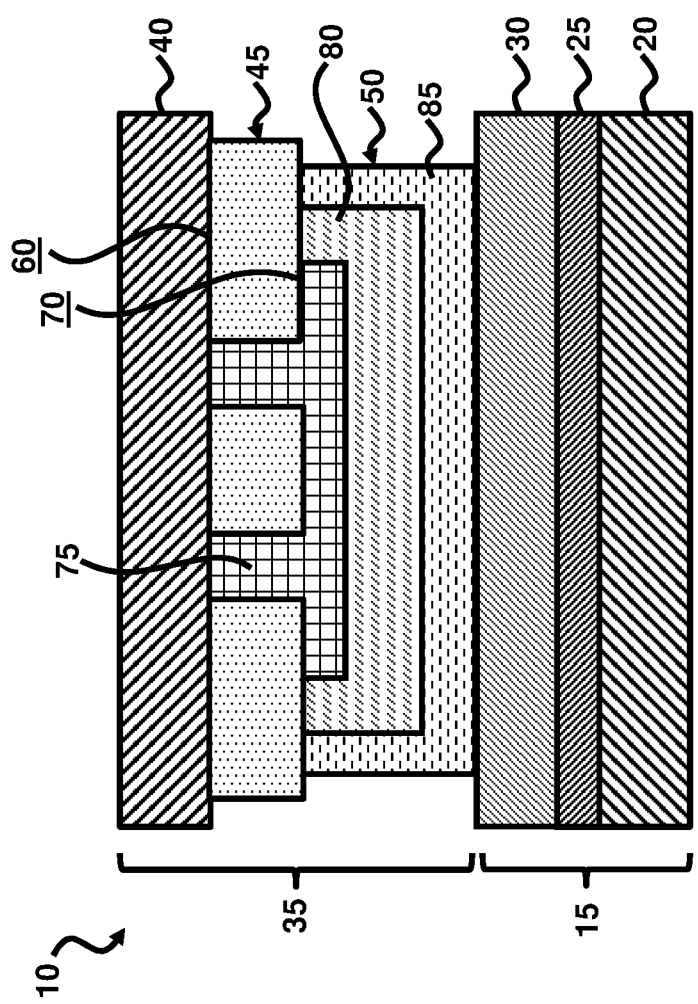
FIG. 3 is a schematic cross-sectional diagram illustrating the dual plate OLET display device of FIG. 1 showing the stacked active organic layer, according to an example.

FIG. 3, with reference to FIGS. 1 and 2, is a schematic cross-sectional diagram illustrating an example in which the stacked active organic layer 50 comprises an n-type transport layer 75, an emitting layer 80 partially surrounding the n-type transport layer 75, and a p-type transport layer 85 partially surrounding the emitting layer 80. According to the example shown in FIG. 3, the n-type transport layer 75 contacts the second planar surface 70 and the second substrate 40. The p-type transport layer 85 contacts the second planar surface 70. The emitting layer 80 contacts the second planar surface 70. According to an example, the n-type transport layer 75 may comprise Tris(8-hydroxyquinolinato) aluminum ($Alq_3$), Oligo-thiophene, or other n-type semiconductor materials. According to an example, the n-type transport layer 75 may have a thickness of approximately 10-50 nm, although other thicknesses may be possible. According to an example, the emitting layer 80 may comprise $Alq_3$, Tris[2-(p-tolyl)pyridinium-1-yl] iridium(III) (Ir $(mppy)_3$), or other host-dopant emissive materials. According to an example, the emitting layer 80 may have a thickness of approximately 10-50 nm, although other thicknesses may be possible. According to an example, the p-type transport layer 85 may comprise triphenylamine and derivatives, or other p-type semiconductor materials. According to an example, the p-type transport layer 85 may have a thickness of approximately 10-50 nm, although other thicknesses may be possible. According to some examples, the charge transport occurs in the n-type transport layer 75 and the p-type transport layer 85, and electroluminescence originates in the emitting layer 80. Furthermore, hole accumulation may occur in the p-type transport layer 85, electron accumulation may occur in the n-type transport layer 75, and exciton formation may occur in the emitting layer 80. According to an example, the emitting layer 80 does not contact the dielectric layer 30.

Figure 4:
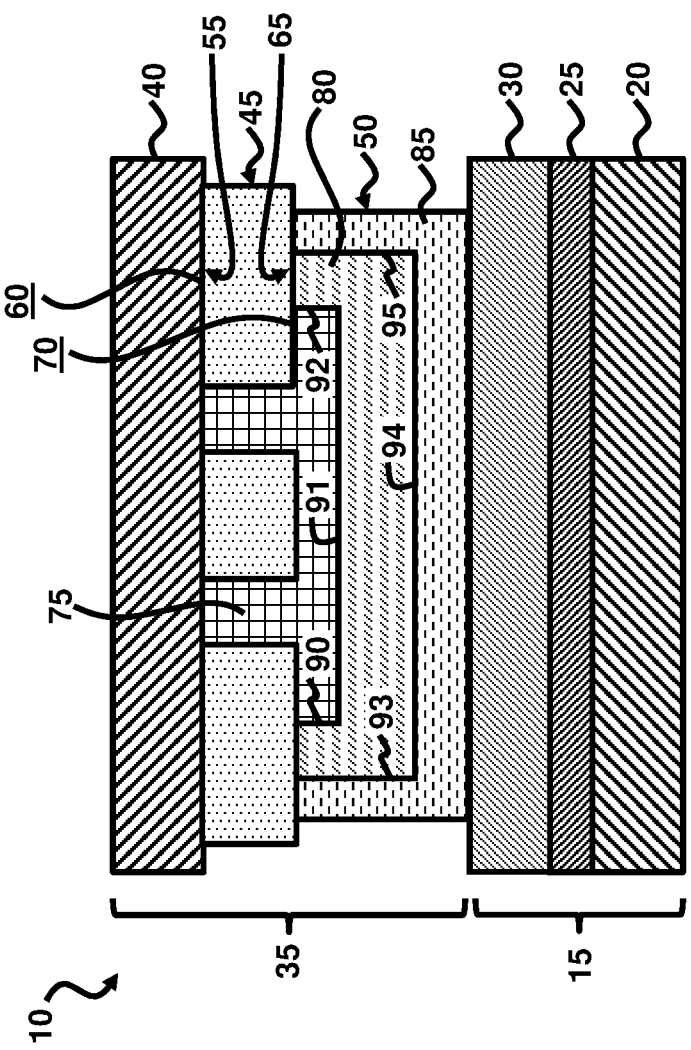
FIG. 4 is a schematic cross-sectional diagram illustrating the dual plate OLET display device of FIG. 1 showing additional aspects of the stacked active organic layer, according to an example.

FIG. 4, with reference to FIGS. 1 through 3, is a schematic cross-sectional diagram illustrating an example in which the emitting layer 80 directly surrounds three sides 90, 91, 92 of the n-type transport layer 75. The p-type transport layer 85 directly surrounds three sides 93, 94, 95 of the emitting layer 80. Moreover, the p-type transport layer 85 surrounds the three sides 90, 91, 92 of the n-type transport layer 75. This example arrangement of the stacked active organic layer 50, and particularly the arrangement of the n-type transport layer 75, emitting layer 80, and p-type transport layer 85 may provide stability of the dual plate OLET display device 10 because n-type semiconductor materials as provided in the n-type transport layer 75 may not always be fully stable when exposed to the air, while p-type semiconductor materials as provided in the p-type transport layer 85 may be more stable when exposed to the air. According to the arrangement of the stacked active organic layer 50 shown in FIG. 4, the n-type transport layer 75 is enclosed on three sides 90, 91, 92 by the emitting layer 80, which is enclosed on three sides 93, 94, 95 by the p-type transport layer 85. Accordingly, the n-type transport layer 75 is protected by both the emitting layer 80 and the p-type transport layer 85. Furthermore, the n-type transport layer 75 is protected by the source/drain layer 45 and second substrate 40 to reduce and/or eliminate exposure of the n-type transport layer 75 to air. Additionally, attachment of the second plate device 35 to the first plate device 15 may occur in air or in a vacuum since the n-type transport layer 75 is shielded from air by the emitting layer 80 as well as the p-type transport layer 85 along with the source/drain layer 45 and the second substrate 40.

Figure 5:
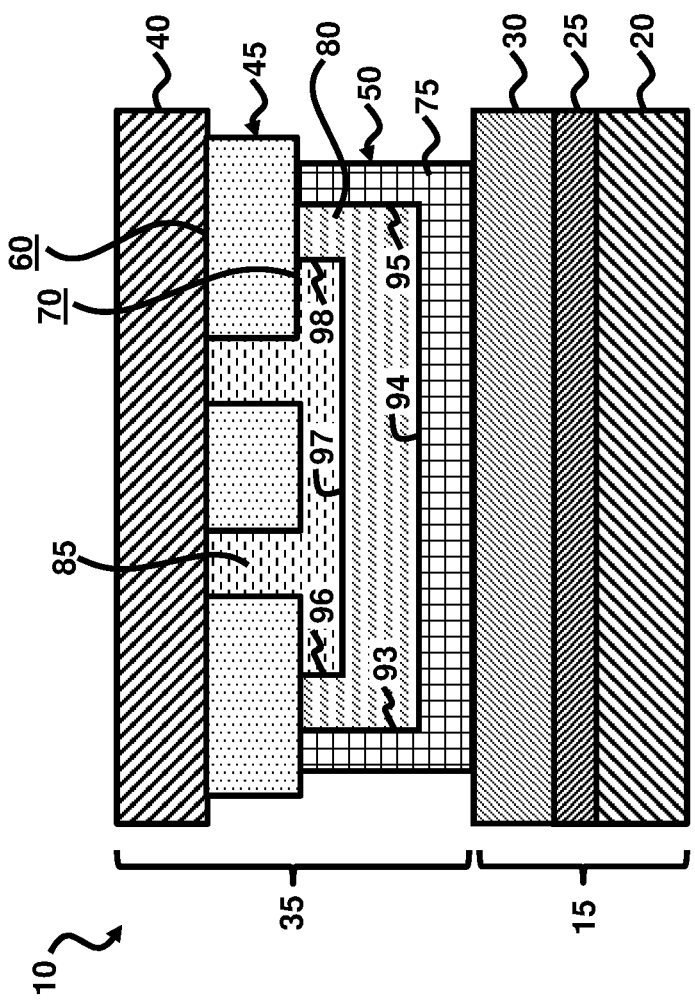
FIG. 5 is a schematic cross-sectional diagram illustrating the dual plate OLET display device of FIG. 1 showing the stacked active organic layer, according to an example.

FIG. 5, with reference to FIGS. 1 through 4, is a schematic cross-sectional diagram illustrating an example in which the stacked active organic layer 50 comprises a p-type transport layer 85, an emitting layer 80 partially surrounding the p-type transport layer 85, and an n-type transport layer 75 partially surrounding the emitting layer 80. In this example, the arrangement of the stacked active organic layer 50 is opposite to the arrangement shown and described in FIGS. 3 and 4 such that the n-type transport layer 75 contacts the dielectric layer 30 and the p-type transport layer 85 contacts the second substrate 40. In the example of FIG. 5, the emitting layer 80 is similarly positioned as provided in the arrangement shown in FIGS. 3 and 4. Accordingly, in FIG. 5, the n-type transport layer 75 directly surrounds three sides 93, 94, 95 of the emitting layer 80, and the emitting layer 80 directly surrounds three sides 96, 97, 98 of the p-type transport layer 85. As such, the n-type transport layer 75 also surrounds the three sides 96, 97, 98 of the p-type transport layer 85. To avoid exposing the n-type transport layer 75 to air in the arrangement of the dual plate OLET display device 10 shown in FIG. 5, the attachment of the second plate device 35 to the first plate device 15 may occur in a vacuum.

Figure 6:
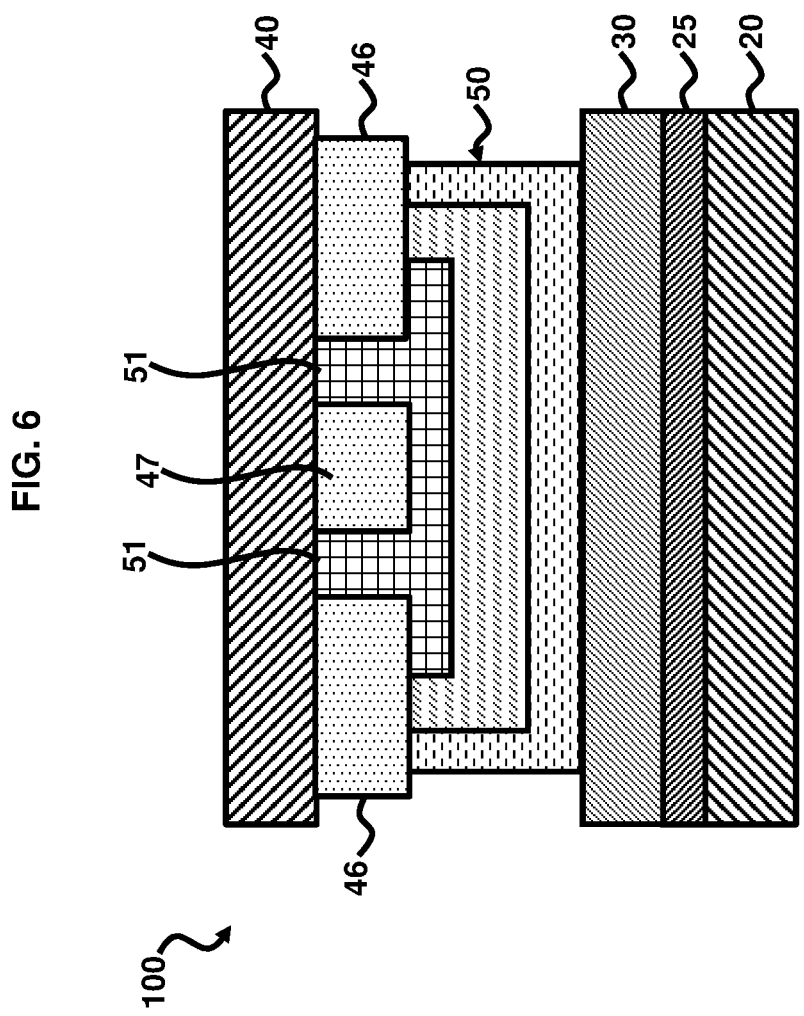
FIG. 6 is a schematic cross-sectional diagram illustrating a dual plate OLET display device, according to an example.

FIG. 6, with reference to FIGS. 1 through 5, is a schematic cross-sectional diagram illustrating an example dual plate OLET display device 100 comprising a first substrate 20, a gate layer 25 contacting the first substrate 20, a dielectric layer 30 contacting the gate layer 25, a stacked active organic layer 50 contacting the dielectric layer 30, a pair of source electrodes 46 contacting the stacked active organic layer 50, and a drain electrode 47 contacting the stacked active organic layer 50. The drain electrode 47 is aligned and spaced apart from the pair of source electrodes 46. The drain electrode 47 may be positioned between the pair of source electrodes 46. In an example, the drain electrode 47 is aligned with the pair of source electrodes 46 such that the drain electrode 47 and the pair of source electrodes 46 are planar to each other. The pair of source electrodes 46 and the drain electrode 47 may each comprise heavy doped silicon, Mo, Al, Cu, Ti, Ag, Au, ITO, IZO, or some other suitable conducting material. According to an example, the pair of source electrodes 46 and the drain electrode 47 may each have a thickness of approximately 50-500 nm, although other thicknesses may be possible. The OLET display device 100 also includes a second substrate 40 contacting the pair of source electrodes 46, the drain electrode 47, and a portion 51 of the stacked active organic layer 50. The portion 51 of the stacked active organic layer 50 contacting the second substrate 40 corresponds with the spacing between the drain electrode 47 and the pair of source electrodes 46; i.e., the channel length. As further described below, the first substrate 20, the gate layer 25, and the dielectric layer 30 are fabricated together prior to connecting the dielectric layer 30 to the stacked active organic layer 50. Moreover, the second substrate 40, pair of source electrodes 46, drain electrode 47, and the stacked active organic layer 50 are fabricated together prior to connecting the stacked active organic layer 50 to the dielectric layer 30.

Figure 7:
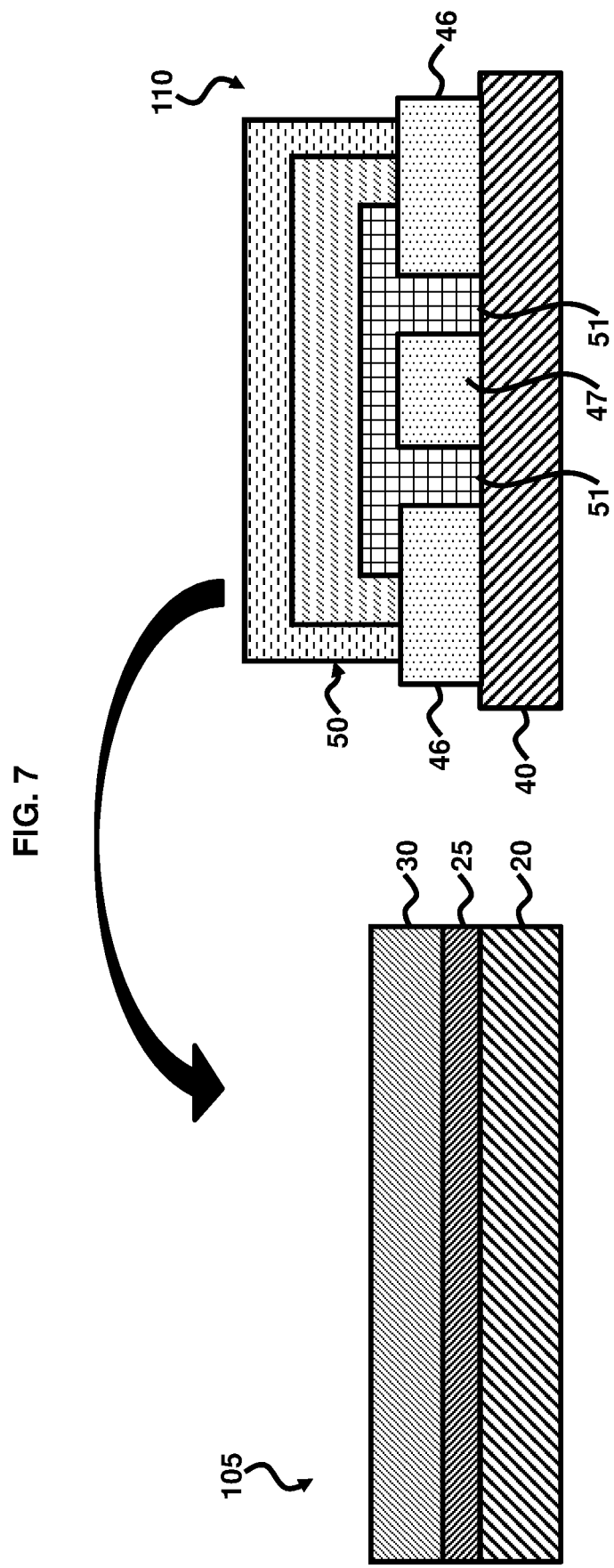
FIG. 7 is a schematic cross-sectional diagram illustrating independent fabrication of the dual plate OLET display device of FIG. 6, according to an example.

FIG. 7, with reference to FIGS. 1 through 6, is a schematic cross-sectional diagram illustrating an example in which the first substrate 20, gate layer 25, and the dielectric layer 30 form a first OLET display device 105. The stacked active organic layer 50, pair of source electrodes 46, drain electrode 47, and the substrate 40 form the second OLET display device 110. Accordingly, the first OLET display device 105 and the second OLET display device 110 are independently fabricated prior to being joined together. The enlarged curved arrow in FIG. 7 indicates that after independent fabrication of the first OLET display device 105 and the second OLET display device 110, the second OLET display device 110 is flipped in order to attach the second OLET display device 110 to the first OLET display device 105. However, in another example, the first OLET display device 105 is flipped in order to attach the first OLET display device 105 to the second OLET display device 110.

Figure 8:
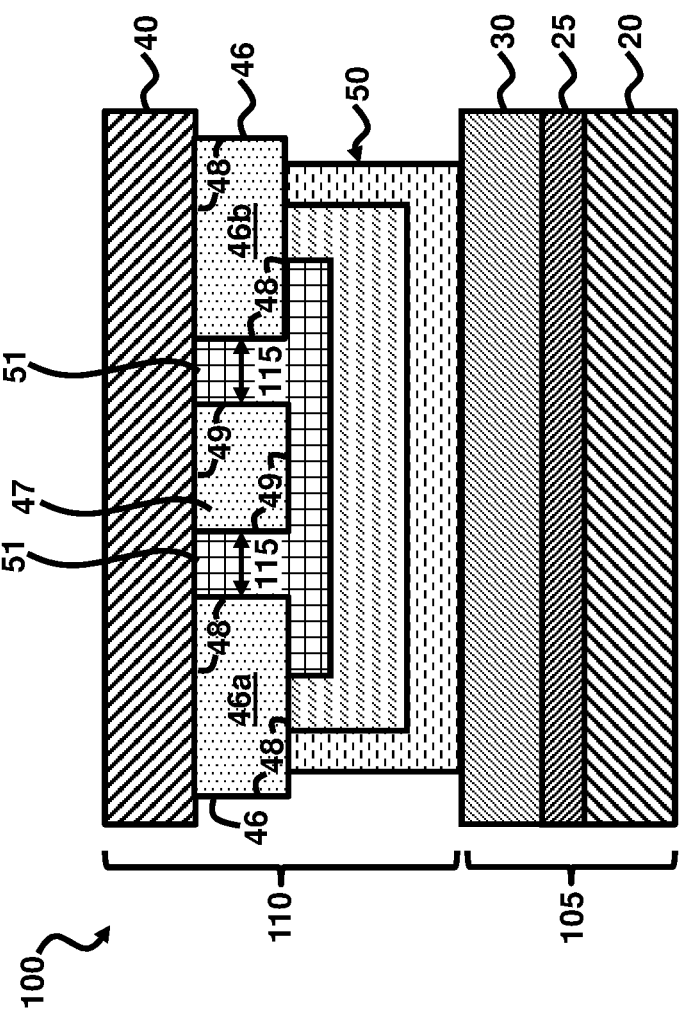
FIG. 8 is a schematic cross-sectional diagram illustrating the dual plate OLET display device of FIG. 6 showing aspects of the source and drain electrodes, according to an example.

FIG. 8, with reference to FIGS. 1 through 7, is a schematic cross-sectional diagram illustrating an example in which each side 48, 49 of the pair of source electrodes 46 and the drain electrode 47 is planar. In this regard, each side 48 of the pair of source electrodes 46 are planar, and each side 49 of the drain electrode 47 is planar. A gap 115 is between the drain electrode 47 and a source electrode 46a, 46b of the pair of source electrodes 46. In this regard, the pair of source electrodes 46 comprises a source electrode 46a and a source electrode 46b. Accordingly, a gap 115 is between the source electrode 46a and the drain electrode 47, and another gap 115 is between the source electrode 46b and the drain electrode 47. Each gap 115 corresponds to the channel length of the dual plate OLET display device 100. According to an example, each gap 115 is less than 3 μm. In an example, the overall feature size of the dual plate OLET display device 100 corresponds to the length of the source electrode 46a plus the gap 115 plus the drain electrode 47 plus the other gap 115 plus the source electrode 46b. The overall feature size may be less than 15 μm, according to an example.

Figure 9A:
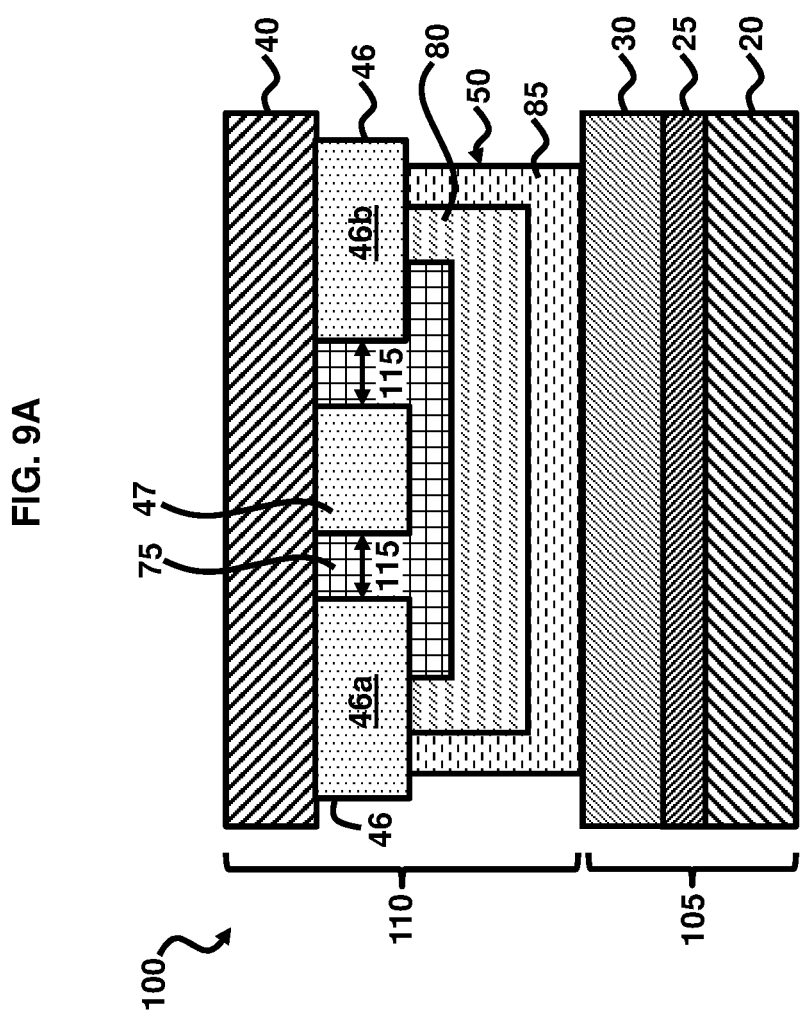
FIG. 9A is a schematic cross-sectional diagram illustrating the dual plate OLET display device of FIG. 6 showing the stacked active organic layer, according to an example.

FIG. 9A, with reference to FIGS. 1 through 8, is a schematic cross-sectional diagram illustrating an example in which the stacked active organic layer 50 comprises an n-type transport layer 75 that fills the gap 115 and contacts the second substrate 40, an emitting layer 80 partially surrounding the n-type transport layer 75, and a p-type transport layer 85 partially surrounding the emitting layer 80. The p-type transport layer 85 contacts the dielectric layer 30 once the second OLET display device 110 is attached to the first OLET display device 105. By having the n-type transport layer 75 filling the gap 115, there is direct contact to facilitate carrier injection between the drain electrode 47 and the n-type transport layer 75. This results in the dual plate OLET display device 100 being more robust and increasing the overall device performance since empty spaces in the dual plate OLET display device 110 are eliminated thereby reducing the chance of broken components once the dual plate OLET display device 110 is implemented in an overall system such as a display screen or television screen, etc.

Figure 9B:
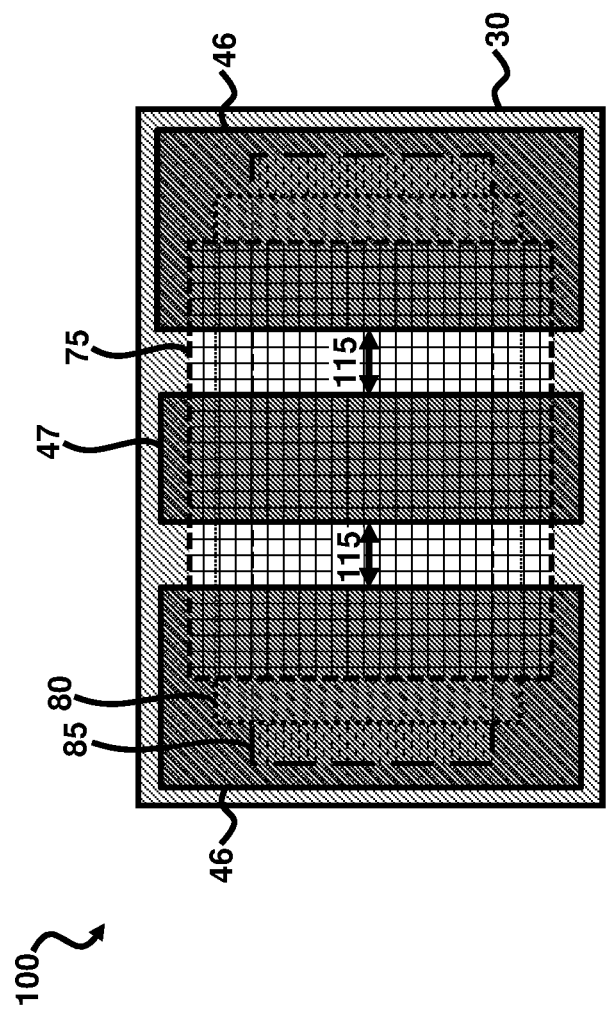
FIG. 9B is a schematic top view diagram illustrating the dual plate OLET display device of FIG. 9A, according to an example.

FIG. 9B, with reference to FIGS. 1 through 9A, is a schematic top view diagram illustrating the dual plate OLET display device 100 of FIG. 9A, according to an example. For clarity of view, the second substrate 40 is not shown in the view of FIG. 9B. While the dielectric layer 30 is shown to extend beyond the perimeter of the pair of source electrodes 46 and drain electrode 47, in other arrangements, the dielectric layer 30 may be planar to the sides of the pair of source electrodes 46 and drain electrode 47 for further alignment of the dual plate OLET display device 100. In FIG. 9B, the p-type transport layer 85 substantially encloses the emitting layer 80, which substantially encloses the n-type transport layer 75 such that the n-type transport layer 75 is protected from exposure to air. However, each of the n-type transport layer 75, emitting layer 80, and p-type transport layer 85 contact the pair of source electrodes 46, and the n-type transport layer 75 contacts the drain electrode 47. Furthermore, as described above, the gap 115 between the drain electrode 47 and the pair of source electrodes 46 is filled with the n-type transport layer 75 to improve device performance and eliminate potential cavities.

Figure 10A:
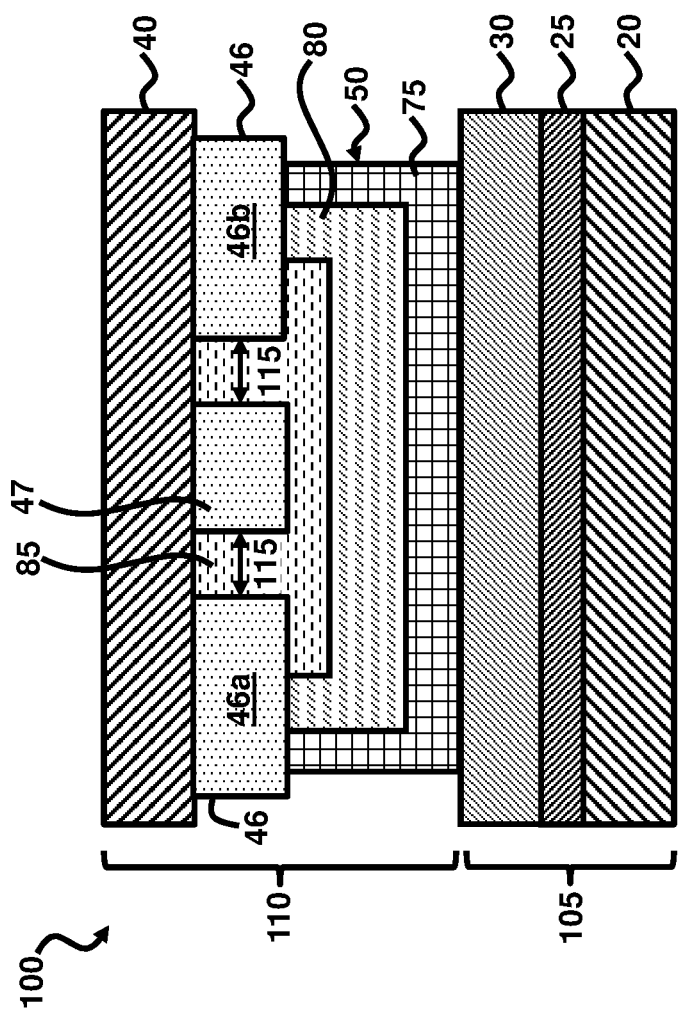
FIG. 10A is a schematic cross-sectional diagram illustrating the dual plate OLET display device of FIG. 6 showing the stacked active organic layer, according to an example.

FIG. 10A, with reference to FIGS. 1 through 9B, is a schematic cross-sectional diagram illustrating an example in which the stacked active organic layer 50 comprises a p-type transport layer 85 that fills the gap 115 and contacts the second substrate 40, an emitting layer 80 partially surrounding the p-type transport layer 85, and an n-type transport layer 75 partially surrounding the emitting layer 80. Accordingly, the arrangement of the stacked active organic layer 50 (i.e., the n-type transport layer 75, emitting layer 80, and p-type transport layer 85) shown in FIG. 10A is opposite to the arrangement of the stacked active organic layer 50 (i.e., n-type transport layer 75, emitting layer 80, and p-type transport layer 85) shown in FIG. 9A. Again, with respect to FIG. 10A, the n-type transport layer 75 contacts the dielectric layer 30 once the second OLET display device 110 is attached to the first OLET display device 105. By having the p-type transport layer 85 filling the gap 115, there is contact to facilitate carrier injection between the drain electrode 47 and the p-type transport layer 85. This results in the dual plate OLET display device 100 being more robust and increasing the overall device performance since empty spaces in the dual plate OLET display device 110 are eliminated thereby reducing the chance of broken components once the dual plate OLET display device 110 is implemented in an overall system such as a display screen or television screen, etc.

Figure 10B:
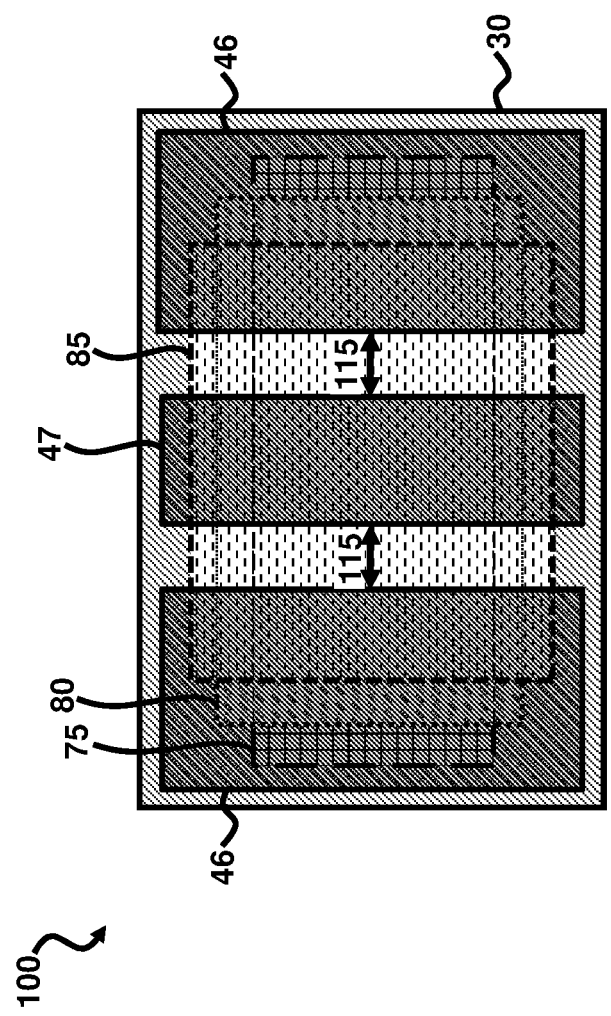
FIG. 10B is a schematic top view diagram illustrating the dual plate OLET display device of FIG. 10A, according to an example.

FIG. 10B, with reference to FIGS. 1 through 10A, is a schematic top view diagram illustrating the dual plate OLET display 100 device of FIG. 10A, according to an example. For clarity of view, the second substrate 40 is not shown in the view of FIG. 10B. While the dielectric layer 30 is shown to extend beyond the perimeter of the pair of source electrodes 46 and drain electrode 47, in other arrangements, the dielectric layer 30 may be planar to the sides of the pair of source electrodes 46 and drain electrode 47 for further alignment of the dual plate OLET display device 100. In FIG. 10B, the n-type transport layer 75 substantially encloses the emitting layer 80, which substantially encloses the p-type transport layer 85. However, each of the n-type transport layer 75, emitting layer 80, and p-type transport layer 85 contact the pair of source electrodes 46, and the p-type transport layer 85 contacts the drain electrode 47. Furthermore, as described above, the gap 115 between the drain electrode 47 and the pair of source electrodes 46 is filled with the p-type transport layer 85 to improve device performance and eliminate potential cavities. Accordingly, the arrangement of the n-type transport layer 75, emitting layer 80, and p-type transport layer 85 shown in FIG. 10B is opposite to the arrangement of the n-type transport layer 75, emitting layer 80, and p-type transport layer 85 shown in FIG. 9B.

Figure 11A:
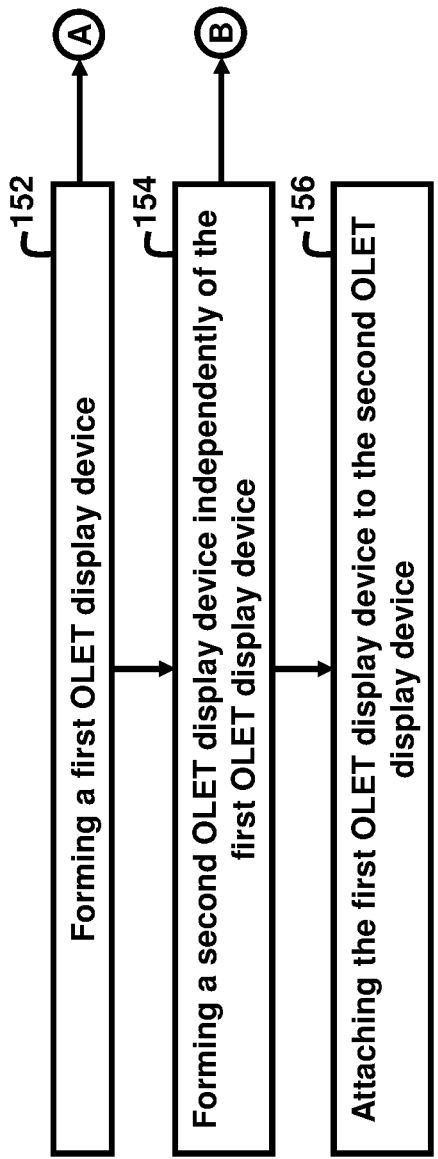
FIG. 11A is a flow diagram illustrating a method of manufacturing a semiconductor device, according to an example.

FIG. 11A, with reference to FIGS. 1 through 10, is a flow diagram illustrating a method 150 of manufacturing a semiconductor device such as a dual plate OLET display device 100, according to an example. At block 152, the method 150 comprises forming a first OLET display device 105. At block 154, the method 150 comprises forming a second OLET display device 110 independently of the first OLET display device 105. The methods of forming the first OLET display device 105 and the second OLET display device 110 occur independently of each other and are further explained below with respect to FIGS. 11B and 110.

Again, with reference to FIG. 11A, at block 156, the method 150 comprises attaching the first OLET display device 105 to the second OLET display device 110. The attaching process may occur in air or in vacuum when the arrangement of the stacked active organic layer 50 (i.e., the n-type transport layer 75, emitting layer 80, and p-type transport layer 85) is similar to that shown and described with reference to FIGS. 1 through 4 and FIGS. 6 through 9B. Moreover, the attaching process may occur in vacuum when the arrangement of the stacked active organic layer 50 (i.e., the n-type transport layer 75, emitting layer 80, and p-type transport layer 85) is similar to that shown and described with reference to FIG. 5, FIG. 10A, and FIG. 10B. In an example, the attachment of the second OLET display device 110 to the first OLET display device 105 may occur using a lamination process. In this regard, the first substrate 20 and the second substrate 40 may each comprise alignment marks, which are not shown in the drawings. Once the first OLET display device 105 and the second OLET display device 110 are independently fabricated, either the first OLET display device 105 or the second OLET display device 110 may be flipped, and an optical microscope, for example, may be used to align the marks in the x-y position until the first OLET display device 105 attaches to the second OLET display device 110. Sealing glue may be used to join the first OLET display device 105 to the second OLET display device 110 once the alignment is set. Moreover, the sealing glue may be used to further seal the dual plate OLET display device 100 from air exposure.

Figure 11B:
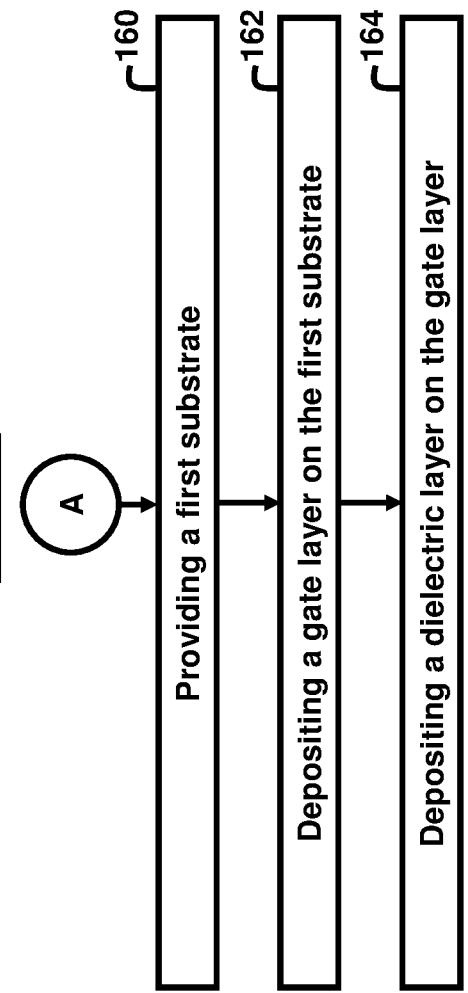
FIG. 11B is a flow diagram illustrating a method of forming a first OLET display device, according to an example.

FIG. 11B, with reference to FIGS. 1 through 11A, is a flow diagram illustrating that at in the method 150, forming (block 152) the first OLET display device 105 comprises, at block 160, providing a first substrate 20. Block 162 describes depositing a gate layer 25 on the first substrate 20. In an example, the gate layer 25 may be deposited on the first substrate 20 using standard photolithography, spin-coating, patterning, and reactive ion etching techniques. Block 164 describes depositing (164) a dielectric layer 30 on the gate layer 25. In an example, the dielectric layer 30 may be deposited; i.e., grown, on the gate layer 25 using standard atomic layer deposition techniques.

Figure 11C:
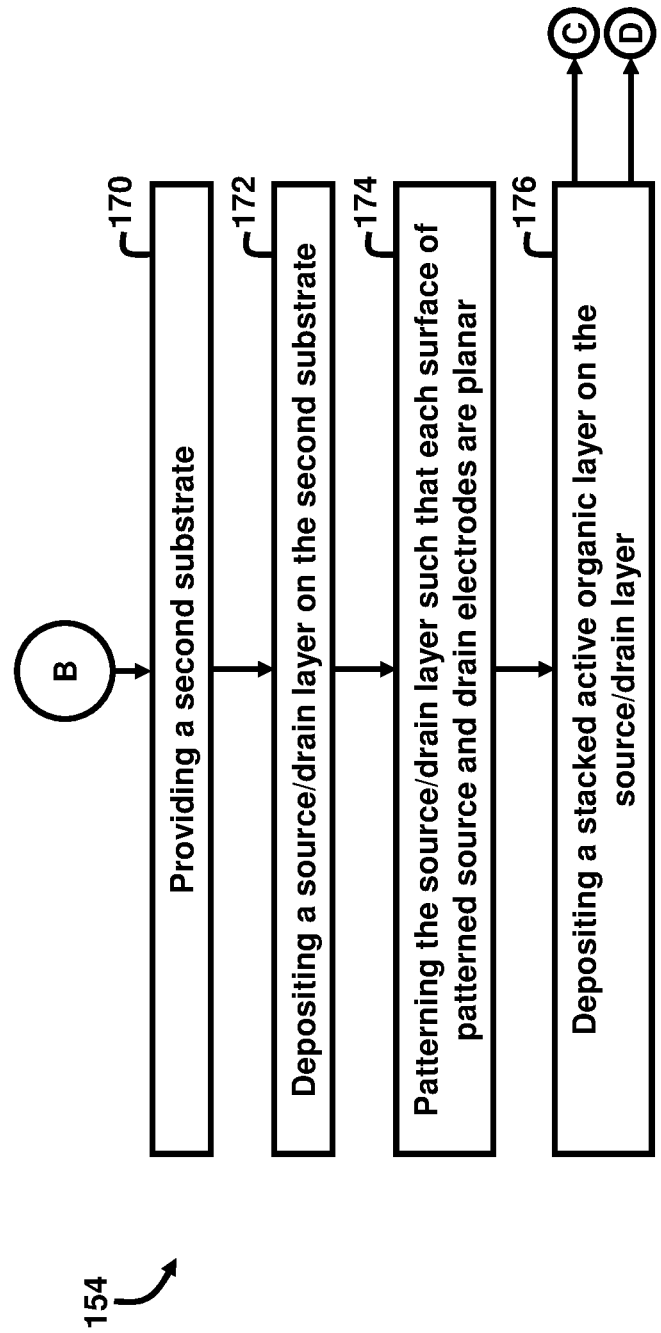
FIG. 11C is a flow diagram illustrating a method of forming a second OLET display device, according to an example.

FIG. 11C, with reference to FIGS. 1 through 11B, is a flow diagram illustrating that in the method 150, forming (154) the second OLET display device comprises providing, at block 170, a second substrate 40. Block 172 provides depositing a source/drain layer 45 on the second substrate 40. Block 174 provides patterning the source/drain layer 45 such that each surface 48, 49 of patterned source and drain electrodes 46a, 46b, 47 are planar. The source/drain layer 45 may be deposited and patterned using standard photolithography, spin-coating, patterning, and reactive ion etching techniques. Block 176 provides depositing a stacked active organic layer 50 on the source/drain layer 45. The stacked active organic layer 50 may also be deposited using photolithography, spin-coating, patterning, and reactive ion etching techniques.

FIG. 11D, with reference to FIGS. 1 through 11O, is a flow diagram illustrating that in the method 150, depositing (176) the stacked active organic layer 50 comprises depositing, at block 180, an n-type transport layer 75 that fills gaps 115 in the patterned source/drain layer 45. The n-type transport layer 75 contacts the second substrate 40 and source electrodes 46a, 46b and drain electrodes 47 in the source/drain layer 45. Depositing (176) the stacked active organic layer 50 further comprises, at block 182, depositing an emitting layer 80 on the n-type transport layer 75. The emitting layer 80 contacts source electrodes 46a, 46b in the source/drain layer 45. Depositing (176) the stacked active organic layer 50 further comprises, at block 184, depositing a p-type transport layer 85 on the emitting layer 80. Using standard photolithography techniques, the p-type transport layer 85 contacts the source electrodes 46a, 46b in the source/drain layer 45. The stacked active organic layer 50; i.e., the n-type transport layer 75, emitting layer 80, and p-type transport layer 85, may be fabricated using standard photolithography, spin-coating, patterning, and reactive ion etching techniques such that the emitting layer 80 directly surrounds three sides 90, 91, 92 of the n-type transport layer 75, the p-type transport layer 85 directly surrounds three sides 93, 94, 95 of the emitting layer 80, and the p-type transport layer 85 surrounds three sides 90, 91, 92 of the n-type transport layer 75. The arrangement of the stacked active organic layer 50 as provided in the method described by FIG. 11D corresponds with the arrangement of the stacked active organic layer 50; i.e., the n-type transport layer 75, emitting layer 80, and p-type transport layer 85, corresponding to FIGS. 1 through 4 and FIGS. 6 through 9B.

FIG. 11E, with reference to FIGS. 1 through 11D, is a flow diagram illustrating that in the method 150, depositing (176) the stacked active organic layer 50 comprises depositing, at block 190, a p-type transport layer 85 that fills gaps 115 in the patterned source/drain layer 45. The p-type transport layer 85 contacts the second substrate 40 and source electrodes 46a, 46b and drain electrodes 47 in the source/drain layer 45. Depositing (176) the stacked active organic layer 50 further comprises depositing, at block 192, an emitting layer 80 on the p-type transport layer 85. The emitting layer 80 contacts source electrodes 46a, 46b in the source/drain layer 45. Depositing (176) the stacked active organic layer 50 further comprises depositing, at block 194, an n-type transport layer 75 on the emitting layer 80. Using standard photolithography techniques, the n-type transport layer 75 contacts the source electrodes 46a, 46b in the source/drain layer 45. The stacked active organic layer 50; i.e., the n-type transport layer 75, emitting layer 80, and p-type transport layer 85, may be fabricated using standard photolithography, spin-coating, patterning, and reactive ion etching techniques such that the n-type transport layer 75 directly surrounds three sides 93, 94, 95 of the emitting layer 80, and the emitting layer 80 directly surrounds three sides 96, 97, 98 of the p-type transport layer 85, and the n-type transport layer 75 also surrounds three sides 96, 97, 98 of the p-type transport layer 85. The arrangement of the stacked active organic layer 50 as provided in the method described by FIG. 11E corresponds with the arrangement of the stacked active organic layer 50; i.e., the n-type transport layer 75, emitting layer 80, and p-type transport layer 85, corresponding to FIG. 5 and FIGS. 10A and 10B.

The present disclosure has been shown and described with reference to the foregoing implementations. Although specific examples have been illustrated and described herein it is manifestly intended that other forms, details, and examples may be made without departing from the scope of the disclosure that is defined in the following claims.

What is claimed is:

1. A dual plate Organic Light-Emitting Field-Effect Transistor (OLET) display device comprising:
    a first plate device comprising:
        a first substrate;
        a gate layer adjacent to the first substrate; and
        a dielectric layer adjacent to the gate layer;
    a second plate device connected to the first plate device, wherein the second plate device comprises:
        a second substrate;
        a source/drain layer adjacent to the second substrate; and
        a stacked active organic layer adjacent to the source/drain layer,
    wherein the first plate device and the second plate device are to be independently fabricated and joined together to position the stacked active organic layer adjacent to the dielectric layer, and
    wherein the source/drain layer comprises:
        a first side comprising a first planar surface contacting the second substrate; and
        a second side opposite to the first side, wherein an entirety of the second side comprises a second planar surface contacting the stacked active organic layer.

2. The device of claim 1, wherein the stacked active organic layer comprises:
    an n-type transport layer;
    an emitting layer partially surrounding the n-type transport layer; and
    a p-type transport layer partially surrounding the emitting layer.

3. The device of claim 2, wherein the n-type transport layer contacts the second planar surface and the second substrate, wherein the p-type transport layer contacts the second planar surface, and wherein the emitting layer contacts the second planar surface.

4. The device of claim 2, wherein the emitting layer surrounds three sides of the n-type transport layer, wherein the p-type transport layer surrounds three sides of the emitting layer, and wherein the p-type transport layer surrounds three sides of the n-type transport layer.

5. The device of claim 1, wherein the stacked active organic layer comprises:
    a p-type transport layer;
    an emitting layer partially surrounding the p-type transport layer; and
    an n-type transport layer partially surrounding the emitting layer.

6. A dual plate Organic Light-Emitting Field-Effect Transistor (OLET) display device comprising:
    a first substrate;
    a gate layer contacting the first substrate;
    a dielectric layer contacting the gate layer;
    a stacked active organic layer contacting the dielectric layer;
    a pair of source electrodes contacting the stacked active organic layer;

a drain electrode contacting the stacked active organic layer, wherein the in electrode is aligned and spaced apart from the pair of source electrodes; and a second substrate contacting the pair of source electrodes, the drain electrode, and a portion of the stacked active organic layer, wherein the first substrate, the gate layer, and the dielectric layer are fabricated together prior to connecting the dielectric layer to the stacked active organic layer.

7. The device of claim 6, wherein each side of the pair of source electrodes and the drain electrode is planar, and wherein a gap between the drain electrode and a source electrode of the pair of source electrodes is less than 3 µm.

8. The device of claim 7, wherein the stacked active organic layer comprises:

an n-type transport layer that fills the gap and contacts the second substrate;

an emitting layer partially surrounding the n-type transport layer; and a p-type transport layer partially surrounding the emitting layer, wherein the p-type transport layer contacts the dielectric layer.

9. The device of claim 7, wherein the stacked active organic layer comprises:

a p-type transport layer that fills the gap and contacts the second substrate;

an emitting layer partially surrounding the p-type transport layer; and an n-type transport layer partially surrounding the emitting layer, wherein the n-type transport layer contacts the dielectric layer.

10. A method of manufacturing a semiconductor device, the method comprising:

forming a first Organic Light-Emitting Field-Effect Transistor (OLET) display device;

forming a second OLET display device independently of the first OLET display device; and attaching the first OLET display device to the second OLET display device.

11. The method of claim 10, wherein forming the first OLET display device comprises:

providing a first substrate;

depositing a gate layer on the first substrate; and depositing a dielectric layer on the gate layer.

12. The method of claim 11, wherein forming the second OLET display device comprises:

providing a second substrate;

depositing a source/drain layer on the second substrate;

patterning the source/drain layer such that each surface of patterned source and drain electrodes are planar; and depositing a stacked active organic layer on the source/drain layer.

13. The method of claim 12, wherein depositing the stacked active organic layer comprises:

depositing an n-type transport layer that fills gaps in the patterned source/drain layer, wherein the n-type transport layer contacts the second substrate and source and drain electrodes in the source/drain layer;

depositing an emitting layer on the n-type transport layer, wherein the emitting layer contacts source electrodes in the source/drain layer; and depositing a p-type transport layer on the emitting layer, wherein the p-type transport layer contacts the source electrodes in the source/drain layer.

14. The method of claim 12, wherein depositing the stacked active organic layer comprises:

depositing a p-type transport layer that fills gaps in the patterned source/drain layer, wherein the p-type transport layer contacts the second substrate and source and drain electrodes in the source/drain layer;

depositing an emitting layer on the p-type transport layer, wherein the emitting layer contacts source electrodes in the source/drain layer; and depositing an n-type transport layer on the emitting layer, wherein the n-type transport layer contacts the source electrodes in the source/drain layer.

15. The device of claim 1, wherein a channel length of the second plate device is less than 3 µm.

16. The device of claim 1, wherein the source/drain layer includes a first electrode, a second electrode, and a gap between the first electrode and the second electrode.

17. The device of claim 16, wherein the stacked organic layer fills the gap.

18. The device of claim 6, wherein a distance between an outer side edge of a first source electrode of the pair of source electrodes and an outer side edge of a second source electrode of the pair of source electrodes is less than 15 µm.

19. The method of claim 12, wherein patterning the source/drain layer includes performing a photolithography process.

20. The method of claim 12, wherein attaching the first OLET display device to the second OLET display device includes a lamination process, comprising:

aligning a first alignment mark formed in the first OLET display device with a second alignment mark formed in the second OLET display device; and joining the first OLET display device to the second OLET display device.

* * * * *